US010726234B2

(12) United States Patent
Son et al.

(10) Patent No.: US 10,726,234 B2
(45) Date of Patent: Jul. 28, 2020

(54) FINGERPRINT SENSING UNIT AND DISPLAY DEVICE INCLUDING THE SAME

(71) Applicant: SAMSUNG DISPLAY CO., LTD., Yongin-si, Gyeonggi-Do (KR)

(72) Inventors: Jungha Son, Yongin-si (KR); Jihun Ryu, Hwaseong-si (KR); Wonsang Park, Yongin-si (KR); Taekyung Ahn, Yongin-si (KR); Byunghan Yoo, Suwon-si (KR); Hanyung Jung, Hwaseong-si (KR); Chaungi Choi, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 146 days.

(21) Appl. No.: 16/119,500

(22) Filed: Aug. 31, 2018

(65) Prior Publication Data
US 2019/0244000 A1  Aug. 8, 2019

(30) Foreign Application Priority Data
Feb. 5, 2018 (KR) .................. 10-2018-0014185

(51) Int. Cl.
*G06K 9/00* (2006.01)
*H01L 27/32* (2006.01)
*H01L 51/52* (2006.01)
*H01L 27/12* (2006.01)

(52) U.S. Cl.
CPC .............. *G06K 9/0002* (2013.01); *G06K 9/00* (2013.01); *H01L 27/3225* (2013.01); *H01L 27/3258* (2013.01); *H01L 27/3262* (2013.01); *H01L 51/5281* (2013.01); *H01L 27/1218* (2013.01); *H01L 27/1248* (2013.01); *H01L 27/323* (2013.01)

(58) Field of Classification Search
CPC .... G06K 9/0002; G06K 9/00; H01L 27/3225; H01L 27/3258; H01L 27/3262; H01L 51/5281
See application file for complete search history.

(56) References Cited

U.S. PATENT DOCUMENTS

| 9,276,078 B2* | 3/2016 | Kim | ........................ H01L 29/45 |
| 9,786,732 B2* | 10/2017 | Jeon | .................... H01L 27/3279 |
| 9,864,448 B2 | 1/2018 | Bae et al. | |
| 2016/0204175 A1* | 7/2016 | Kim | .................... H01L 27/3258 |
| | | | 257/40 |

(Continued)

FOREIGN PATENT DOCUMENTS

| KR | 10-1596377 | 2/2016 |
| KR | 10-1748123 | 6/2017 |
| KR | 10-2017-0100461 | 9/2017 |

*Primary Examiner* — Utpal D Shah
(74) *Attorney, Agent, or Firm* — F. Chau & Associates, LLC (57) ABSTRACT

A fingerprint sensing unit includes a substrate; a buffer layer disposed on the substrate; a thin film transistor disposed on the buffer layer; an insulating layer disposed on the buffer layer and that has an opening that exposes at least a portion of the buffer layer; and a sensing electrode disposed on the portion of the buffer layer that is exposed by the opening, where the sensing electrode is connected to the thin film transistor. A display device that includes the fingerprint sensing unit can reduce internal reflection of external light.

20 Claims, 8 Drawing Sheets

FIG. 10

(56) References Cited

U.S. PATENT DOCUMENTS

| | | |
|---|---|---|
| 2017/0364178 A1 | 12/2017 | Nelson et al. |
| 2018/0089486 A1 | 3/2018 | Kim et al. |
| 2019/0131370 A1* | 5/2019 | Heo .................... H01L 27/3262 |
| 2019/0181205 A1* | 6/2019 | Kim .................... H01L 27/3276 |
| 2019/0259967 A1* | 8/2019 | Yang ................... H01L 27/3258 |

* cited by examiner

FINGERPRINT SENSING UNIT AND DISPLAY DEVICE INCLUDING THE SAME

CROSS-REFERENCE TO RELATED APPLICATION

This application claims priority under 35 U.S.C. § 119 from, and the benefit of, Korean Patent Application No. 10-2018-0014185, filed on Feb. 5, 2018 in the Korean intellectual Property Office (KIPO), the contents of which are herein incorporated by reference in their entirety.

1. Technical Field

Embodiments of the present disclosure are directed to a fingerprint sensing unit and a display device that includes the fingerprint sensing unit.

2. Discussion of Related Art

Display devices can be classified into liquid crystal display ("LCD") devices, organic light emitting diode ("OLED") display devices, plasma display panel ("PDP") display devices or electrophoretic display devices, based on their light emitting schemes.

In recent times, various functions have been added to display devices in addition to the function of displaying images. For example, a display device may have a touch sensing function or a fingerprint recognition function.

Fingerprint sensing can be classified into, for example, a capacitive type, an optical type, a thermal type, or an ultrasonic type. Among them, a capacitive type uses sensing electrodes to recognize a fingerprint by sensing a capacitance difference based on a distance between a ridge and a valley of the fingerprint.

A fingerprint sensing unit has a multilayer structure that includes a plurality of insulating layers. Each layer may include different materials and may have a different refractive index. When each layer has a different refractive index, light reflection or total reflection may occur at interlayer interfaces. In particular, when external light reflection occurs in a fingerprint sensing unit, display quality of a display device can be degraded.

SUMMARY

Embodiments of the present disclosure provide a fingerprint sensing unit that can reduce reflection of external light to improve display quality and to a display device that includes the fingerprint sensing unit.

According to an embodiment, a fingerprint sensing unit includes: a substrate; a buffer layer disposed on the substrate; a thin film transistor disposed on the buffer layer; an insulating layer disposed on the buffer layer and that has an opening that exposes at least a portion of the buffer layer; and a sensing electrode disposed on the portion of the buffer layer that is exposed by the opening, where the sensing electrode is connected to the thin film transistor.

The sensing electrode may directly contact the buffer layer.

Only the buffer layer may be disposed between at least a part of the sensing electrode and the substrate.

An area of the opening may range from about 50% to about 80% of a planar area of the substrate.

An area of the insulating layer may range from about 20% to about 50% of a planar area of the substrate.

An edge of the opening may form a closed loop on a plane, and the closed loop has one of a circular, polygonal or irregular shape.

The buffer layer may include one of silicon nitride ($SiN_x$), silicon oxide ($SiO_2$), or silicon oxynitride ($SiO_xN_y$).

The insulating layer may include a first insulating layer, a second insulating layer, and a third insulating layer.

The thin film transistor may include: an active layer disposed between the buffer layer and the first insulating layer; a gate electrode disposed between the first insulating layer and the second insulating layer; and a source electrode and a drain electrode disposed between the second insulating layer and the third insulating layer.

According to an embodiment, a fingerprint sensing unit includes: a substrate; a thin film transistor disposed on the substrate; a first insulating layer disposed on the substrate; a second insulating layer disposed on the first insulating layer and that has an opening that exposes at least a portion of the first insulating layer; and a sensing electrode disposed on the portion of the first insulating layer that is exposed by the opening, where the sensing electrode is connected to the thin film transistor.

The sensing electrode may directly contact the first insulating layer.

Only the first insulating layer may be disposed between at least a part of the sensing electrode and the substrate.

An area of the opening may range from about 50% to about 80% of a planar area of the substrate.

The first insulating layer may include one of silicon nitride ($SiN_x$), silicon oxide ($SiO_2$), or silicon oxynitride ($SiO_xN_y$).

The fingerprint sensing unit may further include a third insulating layer disposed on the second insulating layer. The second and third insulating layers may have the opening that exposes at least a portion of the first insulating layer.

According to an embodiment, a display device includes: a display unit; and a fingerprint sensing unit disposed on the display unit. The display unit includes: a base substrate; and an organic light emitting element disposed on the base substrate. The fingerprint sensing unit includes: a buffer layer disposed on the display unit; a thin film transistor disposed on the buffer layer; an insulating layer disposed on the buffer layer and that has an opening that exposes at least a portion of the buffer layer; and a sensing electrode disposed on the portion of the buffer layer that is exposed by the opening, where the sensing electrode is connected to the thin film transistor.

The organic light emitting element may include: a first electrode; an organic light emitting layer disposed on the first electrode; and a second electrode disposed on the organic light emitting layer.

The sensing electrode may overlap the first electrode. The sensing electrode may directly contact the buffer layer.

The display device may further include a pixel defining layer disposed on the base substrate and that has a pixel opening that exposes at least a part of the first electrode.

The opening may overlap the pixel opening.

DETAILED DESCRIPTION

Exemplary embodiments will now be described more fully hereinafter with reference to the accompanying drawings. Although exemplary embodiments of the disclosure may be modified in various ways and have several embodiments, exemplary embodiments are illustrated in the accompanying drawings and will be mainly described in the specification. However, the scope of the disclosure is not limited to exemplary embodiments and should he construed as including all the changes, equivalents and substitutions included in the spirit and scope of the disclosure.

In the drawings, thicknesses of a plurality of layers and areas may be exaggerated for clarity and ease of description thereof. Like reference numerals may refer to like elements throughout the specification. When a layer, area, or plate is referred to as being "on" another layer, area, or plate, it may be directly on the other layer, area, or plate, or intervening layers, areas, or plates may be present therebetween.

Throughout the specification. When an element is referred to as being "connected" to another element, the element is "directly connected" to the other element, or "electrically connected" to the other element with one or more intervening elements interposed therebetween.

"About" or "approximately" as used herein is inclusive of the stated value and means within an acceptable range of variation for the particular value as determined by one of ordinary skill in the art, considering the measurement in question and the error associated with measurement of the particular quantity, i.e., the limitations of the measurement system.

Hereinafter, an embodiment of the present disclosure will he described with reference to FIGS, 1 to 7.

Figure 1:
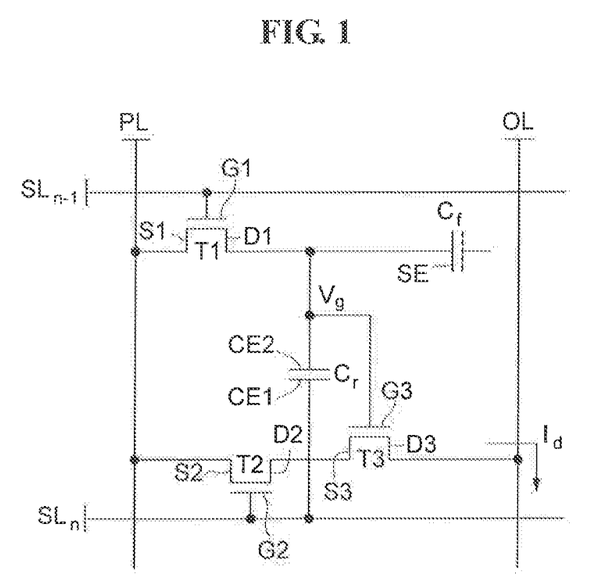
FIG. 1 is a circuit diagram of a fingerprint sensing unit according to an embodiment of the present disclosure.

FIG. 1 is a circuit diagram of a fingerprint sensing unit according to an embodiment of the present disclosure.

Referring to FIG. 1, a fingerprint sensing unit according to an embodiment of the present disclosure includes a plurality of thin film transistors T1, T2, and T3, a plurality of wirings $SL_{n-1}$, $SL_n$, PL, and OL selectively connected to the plurality of thin film transistors T1, T2, and T3, and a reference capacitor Cr.

According to an embodiment, the plurality of thin film transistors T1, T2, and T3 include a first thin film transistor T1, a second thin film transistor T2, and a third thin film transistor T3.

According to an embodiment, a first gate electrode G1 of the first thin film transistor T1 is connected to a first scan line $SL_{n-1}$, a first source electrode SI of the first thin film transistor T1 is connected to a common power line PL, and a first drain electrode D1 of the first thin film transistor T1 is connected to a third gate electrode G3 of the third thin film transistor T3.

According to an embodiment, a second gate electrode G2 of the second thin film transistor T2 is connected to a second scan line $SL_n$, a second source electrode S2 of the second thin film transistor T2 is connected to the common power line PL, and a second drain electrode D2 of the second thin film transistor T2 is connected to a third source electrode S3 of the third thin film transistor T3.

According to an embodiment, the third gate electrode G3 of the third thin film transistor T3 is connected to the first drain electrode D1 of the first thin film transistor T1, the third source electrode S3 of the third thin film transistor T3 is connected to the second drain electrode D2 of the second thin film transistor T2, and a third drain electrode D3 of the third thin film transistor T3 is connected to an output line OL.

As described above, according to an embodiment, a fingerprint sensing unit includes the first scan line $SL_{n-1}$ that transmits a first scan signal to the first gate electrode of the first thin film transistor T1, the second scan line $SL_n$ that transmits a second scan signal to the second gate electrode G2 of the second thin film transistor T2, the common power line PL that transmits a driving voltage to the first source electrode S1 of the first thin film transistor T1 and the second source electrode S2 of the second thin film transistor T2, and the output line OL that transmits a driving current Id that flows through the third thin film transistor T3 to a sensing driver.

According to an embodiment, the reference capacitor Cr includes a first electrode CE1 connected to the second scan line $SL_n$, and a second electrode CE2 connected to the first drain electrode D1 of the first thin film transistor T1, the third gate electrode G3 of the third thin film transistor T3, and a sensing electrode SE.

Hereinafter, the driving of a fingerprint sensing unit according to an embodiment will be described by way of example.

First, according to an embodiment, when a first scan signal is transmitted to the first scan line $SL_{n-1}$ and a driving voltage is transmitted to the common power line PL, the first thin film transistor T1 is turned on. The first scan signal is a pulse signal. For example, the first scan signal may correspond to a low voltage switching period of a signal held at a high voltage, or may correspond to a high voltage switching period of a signal held at a low voltage.

According to an embodiment, when the first thin film transistor T1 is turned on, the driving voltage of the common power line PL is transmitted to the third gate electrode G3 of the third thin film transistor T3 and the second electrode CE2 of the reference capacitor Cr through the first thin film transistor T1. Accordingly, a voltage is transmitted to the third gate electrode G3 of the third thin film transistor T3 and the second electrode CE2 of the reference capacitor Cr, and the third thin film transistor T3 is turned on.

Next, according to an embodiment, when the second scan signal is transmitted to the second scan line $SL_n$ and the driving voltage is transmitted to the common power line PL, the second thin film transistor T2 is turned on. Similar to the first scan signal, the second scan signal is a pulse signal.

According to an embodiment, when the second thin film transistor T2 is turned on and a gate voltage Vg is transmitted to the third gate electrode G3 of the third thin film transistor T3, the driving current Id flows through the second thin film transistor T2 and the third thin film transistor T3. In such an embodiment, a gate voltage Vg varies depending on a fingerprint capacitance Cf that is formed when a touch or a fingerprint contact is made. In detail, the gate voltage Vg of the third gate electrode G3 varies depending on the capacitive coupling between the fingerprint capacitance Cf and the reference capacitance Cr. In addition, the driving current Id flowing through the second thin film transistor T2 and the third thin film transistor T3 varies depending on the gate voltage Vg of the third gate electrode G3.

According to an embodiment, the output line OL transmits the driving current Id to the sensing driver. The sensing driver can detect whether a touch input occurs, the touch coordinates of the touch input, and ridges and valleys of the touch fingerprints based on an amount of change in the driving current Id.

However, according to an embodiment, the structure of a fingerprint sensing unit according to an embodiment of the present disclosure is not limited thereto. A fingerprint sensing unit may include a plurality of thin film transistors, one or more capacitors, and wirings that include one or more scan lines and one or more power lines.

Figure 2:
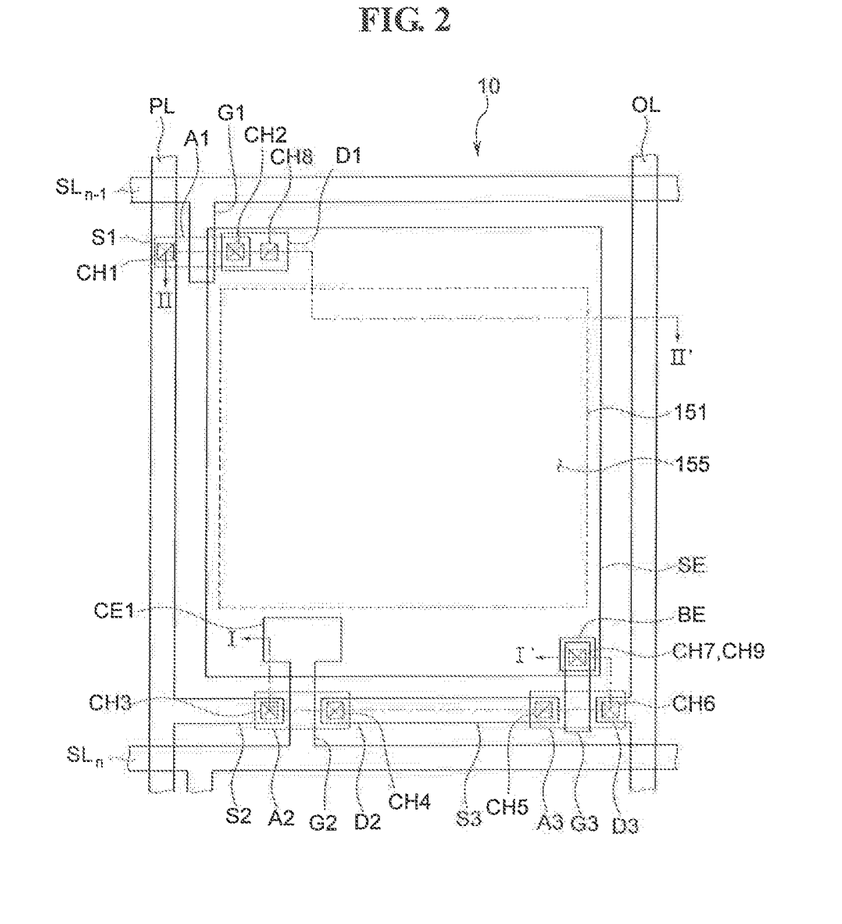
FIG. 2 is a plan view of a part of a fingerprint sensing unit according to an embodiment of the present disclosure.
Figure 3:
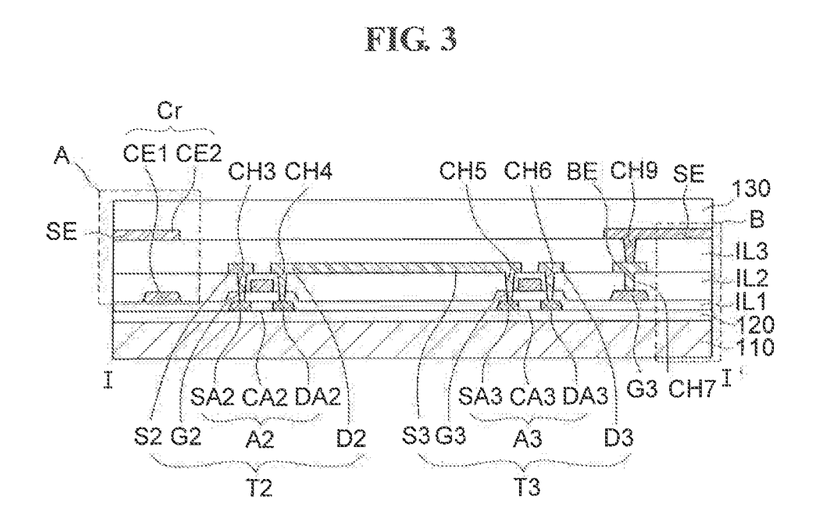
FIG. 3 is a cross-sectional view taken along line I-I' of FIG. 2.

FIG. 2 is a plan view of a part of a fingerprint sensing unit according to an embodiment of the present disclosure. FIG. 3 is a cross-sectional view taken along line I-I' of FIG. 2, and FIG. 4 is a cross-sectional view taken along line II-II' of FIG. 2.

Figure 4:
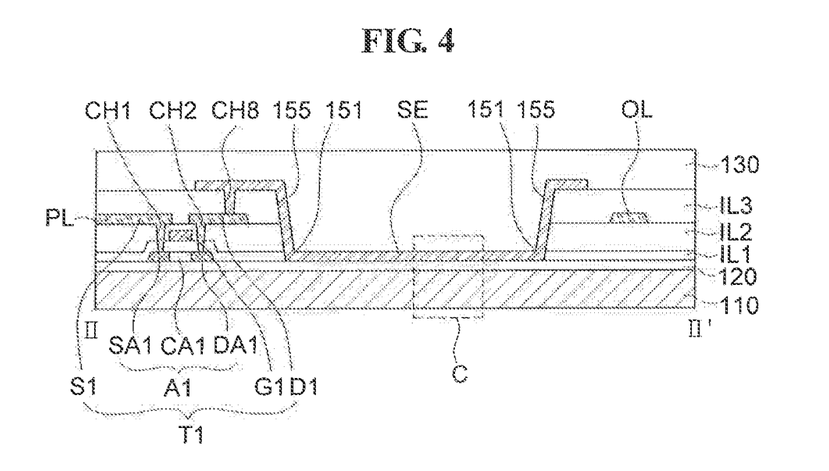
FIG. 4 is a cross-sectional view taken along line II-II' of FIG. 2.

Referring to FIGS. 2, 3, and 4, a fingerprint sensing unit 10 according to an embodiment of the present disclosure includes a substrate 110; and first, second, and third thin film transistors T1, T2, and T3, first and second scan lines $SL_{n-1}$ and $SL_n$, a common power line PL, an output line OL, reference capacitor Cr, a sensing electrode SE, a buffer layer 120, first, second, and third insulating layers IL1, IL2, and IL3, and a protective layer 130 disposed on the substrate 110. In such an embodiment, the first, second, and third thin film transistors T1, T2, and T3 include first, second, and third gate electrodes G1, G2 and G3, first, second, and third source electrodes S1, S2 and S3, first, second, and third drain electrodes D1, D2, and D3, and first, second, and third active layers A1, A2, and A3, respectively. In addition, the reference capacitor Cr includes the first and second electrodes CE1 and CE2, respectively.

According to an embodiment, the substrate 110 is a flexible plastic film. For example, the substrate 110 includes polyimide. However, embodiments are not limited thereto, and the substrate 110 may include an insulating material such as glass or quartz. The substrate 110 includes a material that is mechanically strong, thermally stable, transparent, has a smooth surface, is easy to handle, and water resistant.

According to an embodiment, the buffer layer 120 is disposed on the substrate 110. The buffer layer 120 can substantially prevent penetration of impurities and planarizes the surface, and includes materials capable of performing such a role. For example, the buffer layer 120 includes any one of silicon nitride ($SiN_x$), silicon oxide ($SiO_2$), or silicon oxynitride ($SiO_xN_y$).

According to an embodiment, the first active layer A1, the second active layer A2, and the third active layer A3 are disposed on the buffer layer 120. The first, second, and third active layers A1, A2, and A3 include a semiconductor material. The first active layer A1 includes a first source area SA1, a first drain area DA1, and a first channel area CA1 between the first source and drain areas SA1 and DA1. The second active layer A2 includes a second source area SA2, a second drain area DA2, and a second channel area CA2 between the second source and drain areas SA2 and DA2. The third active layer A3 includes a third source area SA3, a third drain area DA3, and a third channel area CA3 between the third source and drain areas SA3 and DA3.

According to an embodiment, the first, second, and third active layers A1, A2, and A3 include amorphous silicon, polycrystalline silicon, oxide semiconductor, etc. The oxide semiconductor includes at least one selected from oxides based on titanium (Ti), hafnium (Hf), zirconium (Zr), aluminum (Al), tantalum (Ta), germanium (Ge), zinc (Zn), gallium (Ga), tin (Sn), or indium (In), or composite oxides thereof such as zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium germanium oxide (In—Ge—O), indium-germanium-zinc oxide (In—Ge—Zn—O) indium-germanium-tin oxide (In—Ge—Sin—O), indium-germanium-gallium oxide (In—Ge—Ga—O), titanium-indium-zinc oxide (Ti—In—Zn—O), or hafnium-indium-zinc oxide (Hf—In—Zn—O). If the first, second, and third active layers A1, A2, and A3 include an oxide semiconductor, a separate protective layer is additionally provided to protect the oxide semiconductor from external environmental factors such as high temperatures.

According to an embodiment, the first, second, and third source areas SA1, SA2 and SA3 are spaced apart from the first, second, and third drain areas DA1, DA2 and DA3 with the first, second, and third channel areas CA1, CA and CA3 therebetween, respectively. For example, the first, second, and third source areas SA1, SA2, and SA3 and the first, second, and third drain areas DA1, DA2, and DA3 are formed by doping a semiconductor material with an n-type impurity or a p-type impurity.

According to an embodiment, the first insulating layer IL1 is disposed on the first, second, and third active layers A1, A2, and A3. The first insulating layer IL1 is a gate insulating layer. The first insulating layer IL1 includes one of silicon nitride ($SiN_x$), silicon oxide ($SiO_2$), or silicon oxynitride ($SiO_xN_y$).

According to an embodiment, the first gate electrode G1, the second gate electrode G2, and the third gate electrode G3 are disposed on the first insulating layer IL1. The first, second, and third gate electrodes G1, G2 and G3 overlap the first, second, and third active layers A1, A2 and A3, respectively. In particular, the first, second, and third gate electrodes G1, G2 and G3 overlap the first, second, and third channel areas CA1, CA2 and CA3 of the first, second, and third active layers A1, A2 and A3, respectively.

In addition, according to an embodiment, the first scan line $SL_{n-1}$, the second scan line $SL_n$, and the first electrode CE1 are disposed on the first insulating layer IL1. The first electrode CE1 is formed unitarily with the second gate electrode G2.

According to an embodiment, the second insulating layer IL2 is disposed on the first, second, and third gate electrodes G1, G2 and G3, the first and second scan lines $SL_{n-1}$ and SL$_n$, and the first electrode CE1. The second insulating layer IL2 may be an organic insulating layer or an inorganic insulating layer that includes, for example, silicon nitride (SiN$_x$), silicon oxide (SiO$_2$), or silicon oxynitride (SiO$_x$N$_y$).

According to an embodiment, the first, second, and third source electrodes S1, S2 and S3 and the first, second, and third drain electrodes D1, D2 and D3 are disposed on the second insulating layer IL2. The first source electrode S1 contacts the first source area SA1 of the first active layer A1 through a first contact hole CH1 in the first and second insulating layers IL1 and IL2. The first drain electrode D1 contacts the first drain area DA1 of the first active layer A1 through a second contact hole CH2 in the first and second insulating layers IL1 and IL2. The second source electrode S2 contacts the second source area SA2 of the second active layer A2 through a third contact hole CH3 in the first and second insulating layers IL1 and IL2. The second drain electrode D2 contacts the second drain area DA2 of the second active layer A2 through a fourth contact hole CH4 in the first and second insulating layers IL1 and IL2. The third source electrode S3 contacts the third source area SA3 of the third active layer A3 through a fifth contact hole CH5 in the first and second insulating layers IL1 and IL2. The third drain electrode D3 contacts the third drain area DA3 of the third active layer A3 through a sixth contact hole CH6 in the first and second insulating layers IL1 and IL2.

In addition, according to an embodiment, the common power line PL, the output line OL, and a bridge electrode BE are disposed on the second insulating layer IL2. The bridge electrode BE contacts the third gate electrode G3 through a seventh contact hole CH7 in the second insulating layer IL2.

According to an embodiment, the third insulating layer IL3 is disposed on the first, second, and third source electrodes S1, S2 and S3, the first, second, and third drain electrodes D1, D2 and D3, the common power supply line PL, the output line OL, and the bridge electrode BE. The third insulating layer IL3 protects the first, second, and third thin film transistors T1, T2, and T3 and planarizes an upper surface thereof.

According to an embodiment, the third insulating layer IL3 may be an organic insulating layer or an inorganic insulating layer that includes, for example, silicon nitride (SiN$_x$), silicon oxide (SiO$_2$), or silicon oxynitride (SiO$_x$N$_y$). For example, the third insulating layer IL3 includes a photosensitive polymer resin.

According to an embodiment, the first, second, and third insulating layers IL1, IL2, and IL3 have an opening 155. At least a portion of the buffer layer 120 is exposed by the opening 155 in the first, second, and third insulating layers IL1, IL2, and IL3. The opening 155 is an area above the buffer layer 120 that does not overlap the first, second, and third insulating layers IL1, IL2, and IL3. In addition, an edge 151 of the opening 155 is a boundary between the first insulating layer IL1 and the sensing electrode SE in the opening 155.

According to an embodiment, the edge 151 of the opening 155 forms a closed loop on a plane, and the closed loop has a quadrilateral shape as illustrated in FIG. 2. However, embodiments are not limited thereto, and the closed loop may have various shapes, such as a circular shape, a polygonal shape, or an irregular shape.

According to an embodiment, the sensing electrode SE is disposed on the third insulating layer IL3 and in the opening 155. The sensing electrode SE contacts the first drain electrode D1 of the first thin film transistor T1 through an eighth contact hole CH8 in the third insulating layer IL3, and contacts the bridge electrode BE connected to the third gate electrode G3 of the third thin film transistor T3 through a ninth contact hole CH9 in the third insulating layer IL3.

According to an embodiment, at least a portion of the sensing electrode SE is disposed in the opening 155 in the first, second, and third insulating layers IL1, IL2, and IL3. That is, at least a portion of the sensing electrode SE directly contacts the buffer layer 120 exposed through the opening 155. Since only the buffer layer 120 is disposed between the substrate 110 and the sensing electrode SE in the opening 155 without the first, second, and third insulating layers IL2 and IL3 disposed therebetween, reflection of external light is reduced in the fingerprint sensing unit 10, which will be described in detail below.

According to an embodiment, the second electrode CE2 of the reference capacitor Cr is disposed on the third insulating layer IL3. The second electrode CE2 is formed unitarily with the sensing electrode SE. That is, the second electrode CE2 and the sensing electrode SE are formed in substantially a same process using substantially a same material.

According to an embodiment, the sensing electrode SE and the second electrode CE2 include a metal or a transparent conductive oxide (TCO). For example, the sensing electrode SE and the second electrode CE2 may include an aluminum-based metal such as aluminum (Al) or an aluminum alloy, a silver-based metal such as silver (Ag) or a silver alloy, a copper-based metal such as copper (Cu) or a copper alloy, or a molybdenum-based metal such as molybdenum (Mo) or a molybdenum alloy. In addition, the sensing electrode SE and the second electrode CE2 may include a transparent conductive oxide (TCO), for example, one of indium tin oxide (ITO), indium zinc oxide (IZO), zinc oxide (ZnO), carbon nanotube (CNT), or graphene. In addition, the sensing electrode SE and the second electrode CE2 may have a multilayer structure, According to an embodiment, the protective layer 130 is disposed on the sensing electrode SE and the second electrode CE2. The protective layer 130 includes at least one of an organic insulating layer or an inorganic insulating layer. The protective layer 130 protects the sensing electrode SE and the second electrode CE2 and planarizes an upper surface thereof.

Figure 5:
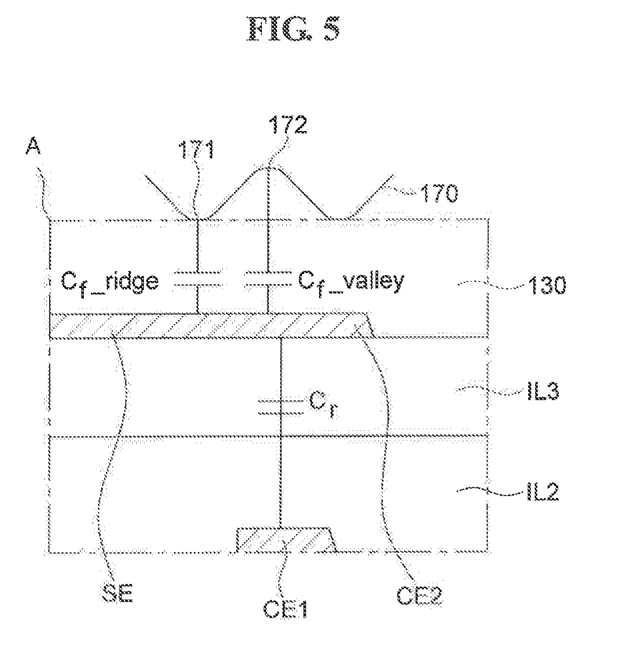
FIG. 5 is an enlarged cross-sectional view of a portion A of FIG. 3.

FIG. 5 is an enlarged cross-sectional view of a portion A of FIG. 3.

Referring to FIG. 5, according to an embodiment, a fingerprint 170 includes a ridge 171 and a valley 172, which have a difference in distance from the sensing electrode SE. That is, a distance between the ridge 171 and the sensing electrode SE is less than a distance between the valley 172 and the sensing electrode SE. Such a distance difference causes a difference between a fingerprint capacitance Cf_ridge between the ridge 171 and the sensing electrode SE and a fingerprint capacitance Cf_valley between the valley 172 and the sensing electrode SE.

As described above, according to an embodiment, a gate voltage Vg of the third gate electrode G3 based on capacitive coupling between the fingerprint capacitance Cf and the reference capacitance Cr varies depending on the difference of fingerprint capacitance Cf. In addition, a driving current Id flowing through the second thin film transistor T2 and the third thin film transistor T3 varies depending on the gate voltage Vg of the third gate electrode G3. A sensing driver can detect whether a touch input occurs, the touch coordinates of the touch input, and ridges and valleys of fingerprints based on an amount of change in the driving current Id.

Figure 6A:
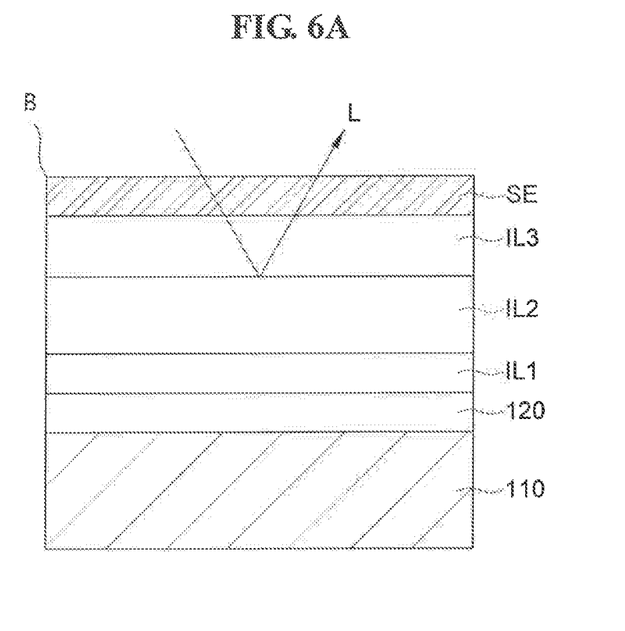
FIG. 6A is an enlarged cross-sectional view of a portion B of FIG. 3.
Figure 6B:
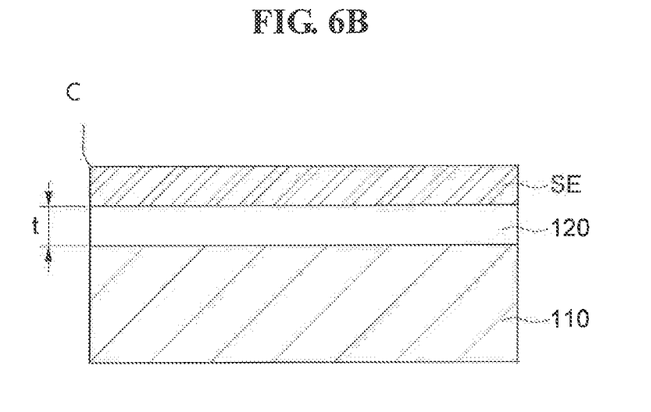
FIG. 6B is an enlarged cross-sectional view of a portion C of FIG. 4.

FIG. 6A is an enlarged cross-sectional view of a portion B of FIG. 3, and FIG. 6B is an enlarged cross-sectional view of a portion C of FIG. 4.

Referring to FIG. 6A, according to an embodiment, the buffer layer 120 and the first, second, and third insulating layers IL1, IL2, and IL3 are disposed between the substrate 110 and the sensing electrode SE in portion B. The buffer layer 120 and the first, second, and third insulating layers IL1, IL2, and IL3 are formed as separate layers, each having a different refractive index.

According to an embodiment, at an interface between layers having different refractive indices, external light reflection can occur. For example, as illustrated in. FIG. 6A, when the second insulating layer IL2 is an inorganic insulating layer with a refractive index of about 1.75, and the third insulating layer IL3 is an organic insulating layer with a refractive index of about 1.5, external light L incident to the fingerprint sensing unit 10 is reflected from an interface between the second insulating layer IL2 and the third insulating layer IL3 due to a refractive index difference between the second insulating layer IL2 and the third insulating layer IL3, thus being recognizable by the user. As such, display quality of a display device that includes the fingerprint sensing unit 10 can be degraded by external light reflection that occurs at the interlayer interface.

Referring to FIG. 6B, according to an embodiment, only the buffer layer 120 is disposed between the substrate 110 and the sensing electrode SE in portion C, and no insulating layers IL1, IL2, and IL3 are disposed therebetween. That is, since no insulating layers IL1, IL2, and IL3 are disposed in the opening 155, external light reflection that would occur at the interface between layers having different refractive indices is substantially prevented. In such an embodiment, the buffer layer 120 disposed between the substrate 110 and the sensing electrode SE substantially prevents diffusion of impurity elements from the substrate 110 into the fingerprint sensing unit 10 and planarizes a surface thereof. The buffer layer 120 has a thickness t that ranges from about 1000 Å to about 5000 Å. For example, the buffer layer 120 has a thickness of about 3000 Å.

According to an embodiment, the fingerprint sensing unit 10 according to an embodiment of the present disclosure includes a plurality of sensing electrodes SE disposed on the substrate 110 and has a plurality of openings 155 that respectively correspond to the plurality of sensing electrodes SE. In such an embodiment, a total area of the plurality of openings 155 ranges from about 50% to about 80% of a planar area of the substrate 110. In other words, each edge 151 of the plurality of openings 155 forms a closed loop in a plane, and a total area enclosed by each of the closed loops ranges from about 50% to about 80% of an area of the substrate 110. That is, a total area of each of the first, second, and third insulating layers IL1, IL2, and IL3 according to an embodiment of the present disclosure ranges from about 20% to about 50% of a planar area of the substrate 110. For example, after the first, second, and third insulating layers IL1, IL2, and IL3 are formed over an entire surface of the substrate 110, about 50% to about 80% of the area of the first, second, and third insulating layers IL1, IL2, and IL3 on the substrate 110 are removed, and about 20% to about 50% of the area remains on the substrate 110.

As such, according to an embodiment of the present disclosure, the plurality of insulating layers IL1, IL2, and IL3 are not disposed over an entire surface of the substrate 110, and at least a part of the plurality of insulating layers IL1, IL2, and IL3 are removed between the substrate 110 and the sensing electrode SE, and accordingly, external light reflection can be reduced, and the display quality can be improved.

Figure 7:
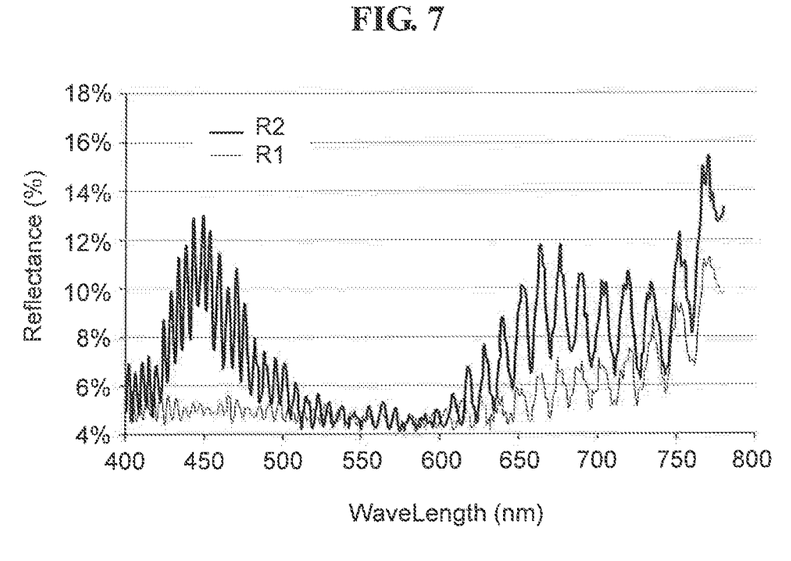
FIG. 7 is a graph of reflectance of a fingerprint sensing unit as a function of wavelength, according to an embodiment of the present disclosure.

FIG. 7 is a graph of reflectance of a fingerprint sensing unit as a function of wavelength, according to an embodiment of the present disclosure. More specifically, reference mark "R1" in FIG. 7 denotes a reflectance of the fingerprint sensing unit according to an embodiment of the present disclosure, in particular, when the area of the opening is about 75% of the planar area of the substrate. In addition, reference mark "R2" in FIG. 7 denotes a reflectance of a conventional fingerprint sensing unlit that does not have an opening. That is, the reference mark "R2" in FIG. 7 denotes the reflectance of a conventional fingerprint sensing unit, when first, second, and third insulating layers are disposed over substantially an entire surface of the substrate, excluding the plurality of contact holes.

Referring to FIG. 7, according to an embodiment, it may be appreciated that the reflectance R1 of the fingerprint sensing unit 10 according to an embodiment of the present disclosure is reduced overall, as compared to the reflectance R2 of a conventional fingerprint sensing unit. Specifically, when the area of the opening 155 defined by the first, second, and third insulating layers IL1, 112, and IL3 is about 75% of the planar area of the substrate 110, the reflectance R1 of the fingerprint sensing unit 10 is reduced to about 3%, as compared to the reflectance R2 of a conventional fingerprint sensing unit that does not have the opening 155.

Since the fingerprint sensing unit 10 according to an embodiment of the present disclosure has the opening 155 in the plurality of first, second, and third insulating layers IL1, IL2, and IL3 between the substrate 110 and the sensing electrode SE, external light reflection is reduced and the display quality is improved.

Hereinafter, an embodiment of the present disclosure will be described with reference to FIG. 8. Those descriptions of configurations that are substantially the same as those of an embodiment of FIGS. 1-7 of the present disclosure will be omitted for convenience of explanation.

Figure 8:
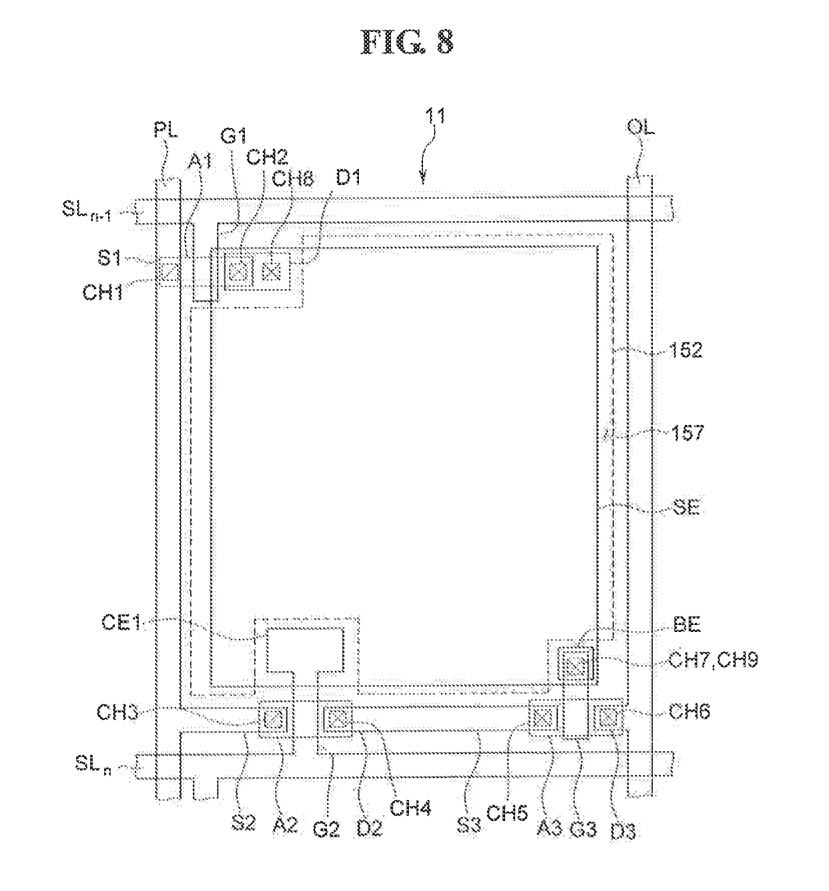
FIG. 8 is a plan view of a fingerprint sensing unit according to an embodiment of the present disclosure.

FIG. 8 is a plan view of a fingerprint sensing unit according to an embodiment of the present disclosure.

Referring to FIG. 8, a fingerprint sensing unit 11 according to an embodiment of the present disclosure has an irregular opening 157 that overlaps at least a part of the sensing electrode SE. That is, an edge 152 of the opening 157 forms a closed loop on a plane, and the closed loop has an irregular shape.

For example, according to an embodiment, when defining a wiring portion as a portion in which first, second, and third thin film transistors T1, T2, and T3, a first scan line $SL_{n-1}$, a second scan line $SL_n$, a common power line PL, and an output line OL are disposed, then the first, second, and third insulating layers IL1, IL2, and IL3 are disposed in an area that overlaps the wiring portion.

According to an embodiment of the present disclosure, the planar area of the opening 157 of fingerprint sensing unit 11 is greater the planar area of the opening 155 of the fingerprint sensing unit 10 according to an embodiment of the present disclosure, and accordingly, external light reflection can he substantially minimized in the fingerprint sensing unit 11.

Hereinafter, an embodiment of the present disclosure will be described with reference to FIG. 9. Those descriptions of configurations that are substantially the same as those of an embodiment of FIGS. 1-8 of the present disclosure will be omitted for convenience of explanation.

Figure 9:
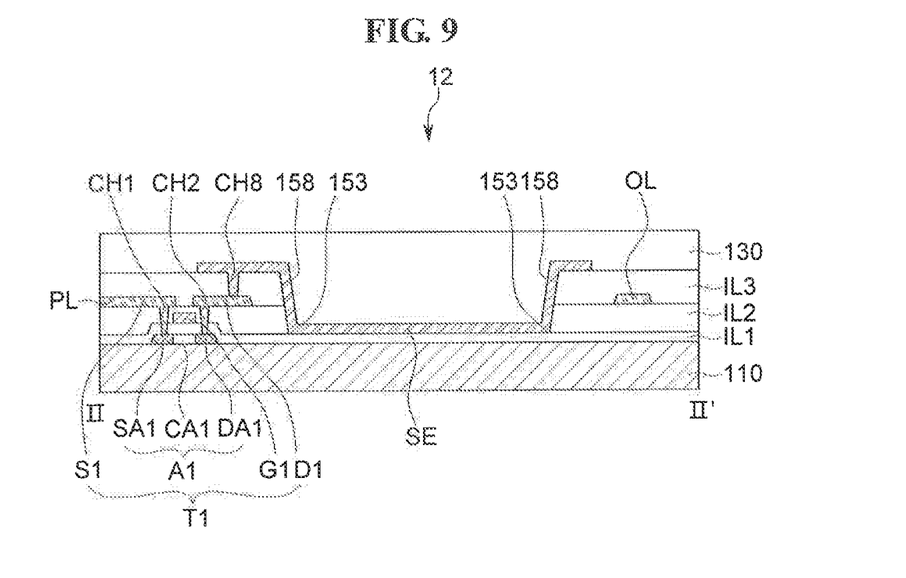
FIG. 9 is a cross-sectional view of a fingerprint sensing unit according to an embodiment of the present disclosure.

FIG. 9 is a cross-sectional view of a fingerprint sensing unit according to an embodiment of the present disclosure.

Referring to FIG. 9, a fingerprint sensing unit 12 according to an embodiment of the present disclosure does not include a buffer layer 120. The fingerprint sensing unit 12 according to an embodiment of the present disclosure includes a substrate 110; and first, second, and third thin film transistors T1, T2, and T3, first and second scan lines $SL_{n-1}$ and $SL_n$, a common power line PL, an output line OL, a sensing electrode SE, first, second, and third insulating layers IL1, IL2, and IL3, and a protective layer 130 disposed on the substrate 110.

According to an embodiment, an opening 158 is formed in the second and third insulating layers IL2 and IL3. At least a portion of the first insulating layer IL1 is exposed through the opening 158. The opening 158 is an area above the first insulating layer IL1 that does not overlap the second and third insulating layers IL2 and IL3. In addition, an edge 153 of the opening 158 is a boundary between the second insulating layer IL2 and the sensing electrode SE in the opening 158.

According to an embodiment, the edge 153 of the opening 158 forms a closed loop on a plane, and the closed loop may have various shapes, such as a circular shape, a polygonal shape, or an irregular shape.

According to an embodiment, at least a portion of the sensing electrode SE is disposed in the opening 158 in the second and third insulating layers IL2 and IL3. That is, at least a portion of the sensing electrode SE directly contacts the first insulating layer IL1 that is exposed through the opening 158. Since only the first insulating layer IL1 is disposed between the substrate 110 and the sensing electrode SE in the opening 155 without the second and third insulating layers IL2 and IL3 disposed therebetween, external light reflection can be reduced in the fingerprint sensing unit 12.

Hereinafter, a display device that includes a fingerprint sensing unit according to an embodiment of the present disclosure will be described with reference to FIGS. 10 and 11. Those descriptions of configurations that are substantially the same as those of an embodiment of FIGS. 1-9 of the present disclosure will be omitted for convenience of explanation.

Figure 10:
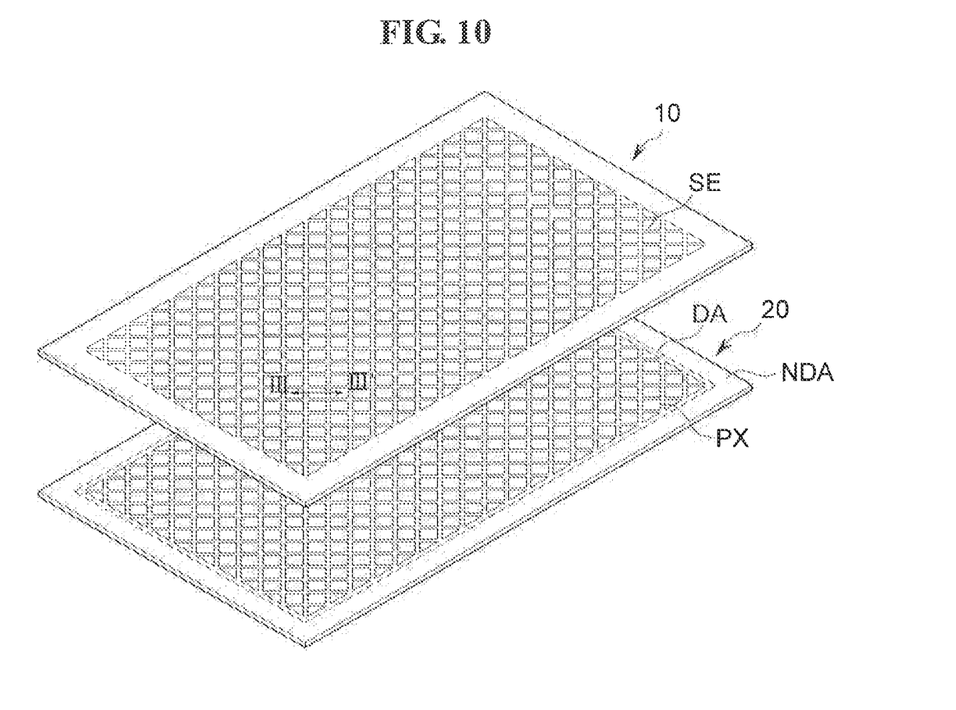
FIG. 10 is a perspective view of a display device that includes a fingerprint sensing unit according to an embodiment of the present disclosure.
Figure 11:
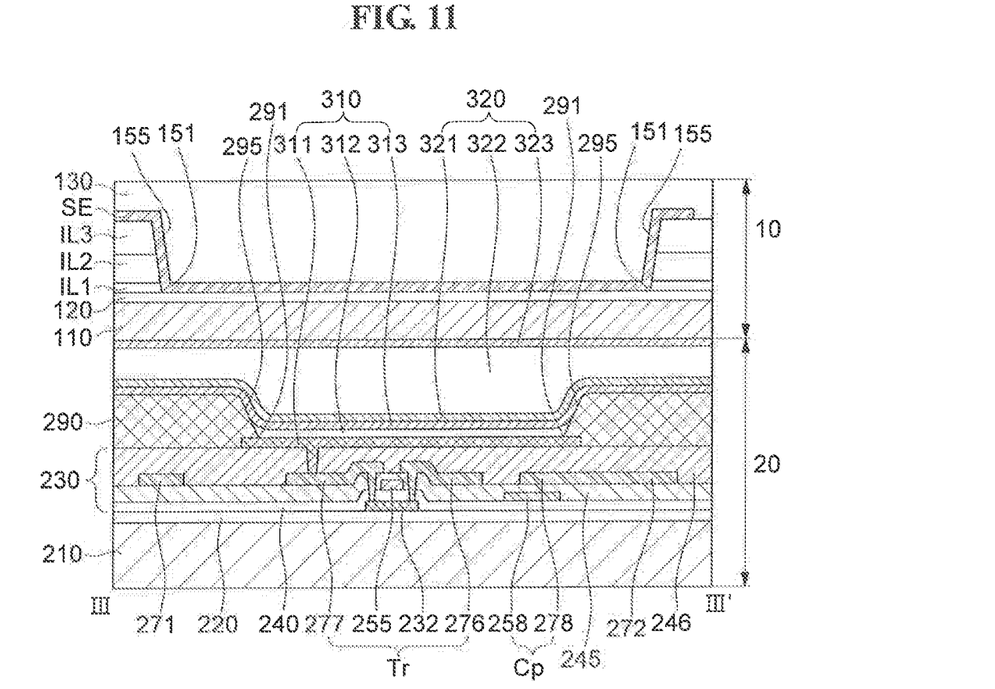
FIG. 11 is a cross-sectional view taken along line of FIG. 10.

FIG. 10 is a perspective view of a display device that includes a fingerprint sensing unit according to an embodiment of the present disclosure, and FIG. 11 is a cross-sectional view taken along line III-III' of FIG. 10.

Referring to FIG. 10, according to an embodiment, a display device includes a fingerprint sensing unit 10 and a display unit 20. In such a case, although the fingerprint sensing unit 10 and the display unit 20 are illustrated separately from each other for ease of description, the fingerprint sensing unit 10 and the display unit 20 may be unitarily formed. In particular, the display device will be described assuming that the fingerprint sensing unit 10 has an on-cell structure directly disposed on the display unit 20. However, embodiments are not limited thereto, and the fingerprint sensing unit 10 may have an in-cell structure formed in the display unit 20. In addition, the display device is assumed to be an organic light emitting diode ("OLED") display device, but embodiments are not limited thereto, and the display device may be a liquid crystal display ("LCD") device.

According to an embodiment, the display unit 20 is divided into a display area DA and a non-display area NDA. The display unit 20 includes a plurality of pixels PX arranged in a matrix form in the display area DA. The plurality of pixels PX are illustrated as having a substantially rhombic shape, but embodiments are not limited thereto, and the plurality of pixels PX may have various other shapes, such as substantially circular or polygonal shapes.

According to an embodiment, the fingerprint sensing unit 10 is disposed on the display unit 20. The fingerprint sensing unit 10 includes a plurality of sensing electrodes SE that detect whether a touch input occurs, the touch coordinates of the touch input, and ridges and valleys of fingerprints. For example, as illustrated in FIG. 10, the fingerprint sensing unit 10 includes the plurality of sensing electrodes SE disposed over an entire surface of a substrate that overlaps the display unit 20. Accordingly, a touch or fingerprint can be sensed over an entire surface of the display device.

Referring to FIG. 11, according to an embodiment, the display unit 20 includes a base substrate 210, a driving circuit unit 230, a pixel defining layer 290, an OLED 310, and a thin film encapsulation layer 320.

According to an embodiment, a buffer layer 220 is disposed on the base substrate 210. The buffer layer 220 can substantially prevent diffusion of undesirable elements and planarizes surface therebelow, and includes materials that can perform such a role. For example, the buffer layer 220 may include one of silicon nitride ($SiN_x$), silicon oxide ($SiO_2$), or silicon oxynitride ($SiO_xN_y$). However, the buffer layer 220 is not always necessary and may be omitted.

According to an embodiment, the driving circuit unit 230 is disposed on the buffer layer 220. The driving circuit unit 230 includes a plurality of thin film transistors Tr and capacitors Cp, and drives the OLED 310. In addition, the driving circuit unit 230 includes a gate line disposed along a first direction, and a data line 271 and a common power line 272 insulated from and that intersect the gate line. The OLED 310 emits light to display images based the driving signal received from the driving circuit unit 230.

A display device according to an embodiment of the present disclosure may have a 2Tr-1 Cap structure in which two thin film transistors Tr and one capacitor Cp are provided in one pixel PX, or may have other structures that include three or more thin film transistors Tr and two or more capacitors Cp in one pixel PX.

According to an embodiment, the capacitor Cp includes a pair of capacitor plates 258 and 278 with an insulating interlayer 245 interposed therebetween. In such an embodiment, the insulating interlayer 245 is a dielectric element. A capacitance of the capacitor Cp is determined by electric charges accumulated in the capacitor Cp and a voltage between the pair of capacitor plates 258 and 278.

According to an embodiment, the thin film transistor Tr includes a semiconductor layer 232, a gate electrode 255, a source electrode 276 and a drain electrode 277. The semiconductor layer 232 is insulated from the gate electrode 255 by a gate insulating layer 240. The thin film transistor Tr transmits, to a first electrode 311, a driving power for an organic light emitting layer 312 of the OLED 310 in a selected pixel PX to emit light. In such an embodiment, the gate electrode 255 is connected to the first capacitor plate 258 of the capacitor Cp, each of the source electrode 276 and the second capacitor plate 278 of the capacitor Cp is connected to the common power line 272, and the drain electrode 277 is connected to the first electrode 311 of the OED 310 through a contact hole in a planarization layer 246.

According to an embodiment, the planarization layer 246 is disposed on the insulating interlayer 245. The planarization layer 246 includes an insulating material and protects the driving circuit unit 230. The planarization layer 246 and the insulating interlayer 245 include substantially the same material.

According to an embodiment, the first electrode 311 is disposed on the planarization layer 246. The first electrode 311 is a pixel electrode and may be an anode. The first electrode 311 is conductive and is one of a transmissive electrode, a transflective electrode or a reflective electrode.

According to an embodiment, when the first electrode 311 is a transmissive electrode, the first electrode 311 includes a transparent conductive oxide (TCO). For example, at least one of indium tin oxide (ITO), indium zinc oxide (IZO), zinc oxide (ZnO) or indium tin zinc oxide (ITZO) can be used as a TCO. When the first electrode 311 is a transflective electrode or a reflective electrode, the first electrode 311 includes at least one of Ag, Mg, Al, Pt, Pd, Au, Ni, Nd, Ir, Cr, or Cu.

According to an embodiment, the pixel defining layer 290 that divides a light emission area is disposed on the planarization layer 246. In such an embodiment, the light emission area is also referred to as a pixel area. The pixel defining layer 290 includes a polymer organic material. For example, the pixel defining layer 290 may include at least one of a polyimide (PI)-based resin, a polyacrylic resin, a polyethylene terephthalate (PET) resin, or a polyethylene naphthalate (PEN) resin.

According to an embodiment, pixel defining layer 290 includes a pixel opening 295 and at least a portion of the first electrode 311 is exposed through the pixel opening 295. The first electrode 311 overlaps at least a portion of the pixel defining layer 290 outside pixel opening 295 and does not overlap the pixel defining layer 290 in the pixel opening 295. The pixel opening 295 is an area above the first electrode 311 that does not overlap the pixel defining layer 290. In addition, an edge 291 of the pixel opening 295 is a boundary at which the pixel defining layer 290 contacts the first electrode 311 at the pixel opening 295.

According to an embodiment, the organic light emitting layer 312 is disposed on the first electrode 311. Specifically, the organic light emitting layer 312 is disposed in the pixel opening 295 on the first electrode 311. The organic light emitting layer 312 is disposed on a sidewall of the pixel opening 295 in the pixel defining layer 290, and on the first electrode 311.

According to an embodiment, the organic light emitting layer 312 includes a light emitting material. In addition, the organic light emitting layer 312 may include a host and a light emitting dopant. The organic light emitting layer 312 is manufactured by a known method using a known material. For example, the organic light emitting layer 312 may be formed through various methods such as a vacuum deposition method, a spin coating method, a cast method, a Langmuir-blodgett (LB) method, an inkjet printing method, a laser printing method, a laser induced thermal imaging (LITI) method, etc.

According to an embodiment, a second electrode 313 is disposed on the organic light emitting layer 312. The second electrode 313 is a common electrode and may be a cathode. The second electrode 313 may be a transmissive electrode, a transflective electrode, or a reflective electrode.

According to an embodiment, when the second electrode 313 is a transmissive electrode, the second electrode 313 includes at least one of Li, Ca, LiF/Ca, LiF/Al, Al, Mg, BaF, Ba, Ag, or Cu. For example, the second electrode 313 includes a mixture of Ag and Mg. When the second electrode 313 is a transflective electrode or a reflective electrode, the second electrode 313 includes at least one of Ag, Mg, Al, Pt, Pd, Au, Ni, Nd, Ir, Cr, Li, Ca, LiF/Ca, LiF/Al, Mo, Ti or Cu. In addition, the second electrode 313 may further include a transparent conductive layer, which includes, for example, indium tin oxide (ITO), indium zinc oxide (IZO), zinc oxide (ZnO), or indium-zinc-tin oxide (IZTO), in addition to the transflective electrode or the reflective electrode.

According to an embodiment, at least one of a hole injection layer (HIL) and a hole transport layer (HTL) is disposed between the first electrode 311 and the organic light emitting layer 312, and at least one of an electron transport layer (ETL) and an electron injection layer (EIL) is disposed between the organic light emitting layer 312 and the second electrode 313.

According to an embodiment, when the OLED 310 is a top emission type, the first electrode 311 is a reflective electrode, and the second electrode 313 is a transmissive electrode or a transflective electrode. When the OLED 310 is a bottom emission type, the first electrode 311 is a transmissive electrode or a transflective electrode, and the second electrode 313 is a reflective electrode. According to an embodiment, the OLED 310 is a top emission type, the first electrode 311 is a reflective electrode, and the second electrode 313 is a transflective electrode.

According to an embodiment, a thin film encapsulation layer 320 is disposed on the second electrode 313 to protect the OLED 310. The thin film encapsulation layer 320 substantially prevents outside air such as moisture or oxygen from penetrating into the OLED 310.

According to an embodiment, the thin film encapsulation layer 320 includes at least one inorganic layer 321 and 323 and at least one organic layer 322 which is alternately disposed with the at least one inorganic layer 321 and 323. As illustrated in FIG. 11, the thin film encapsulation layer 320 includes two inorganic layers 321 and 323 and one organic layer 322, but embodiments are not limited thereto.

According to an embodiment, the inorganic layers 321 and 323 include one or more inorganic materials of: $Al_2O_3$, $TiO_2$, ZrO, $SiO_2$, AlON, AlN, SiON, $Si_3N4$, ZnO, or $Ta_2O_5$. The inorganic layers 321 and 323 can be formed through methods such as chemical vapor deposition (CVD) or atomic layer deposition (ALD). However, embodiments are not limited thereto, and the inorganic layers 321 and 323 can be formed through other methods known to those skilled in the pertinent art.

According to an embodiment, the organic layer 322 includes a polymer-based material. Examples of a polymer-based material include, for example, an acrylic resin, an epoxy resin, polyimide or polyethylene. The organic layer 322 can be formed through a thermal deposition process. A thermal deposition process that forms the organic layer 322 is performed in a temperature range that does not damage the OLED 310. However, embodiments are not limited thereto, and the organic layer 322 can be formed through other methods known to those skilled in the pertinent art.

According to an embodiment, the inorganic layers 321 and 323 have a high density thin film that can substantially prevent or efficiently reduce permeation of, mostly, moisture or oxygen. Permeation of moisture and oxygen into the OLED 310 can be largely prevented by the inorganic layers 321 and 323.

According to an embodiment, moisture and oxygen that have diffused through the inorganic layers 321 and 323 can be further blocked by the organic layer 322. The organic layer 322 has a relatively low permeation prevention efficiency as compared to the inorganic layers 321 and 323. However, the organic layer 322 can serve as a buffer layer that reduces stress between each of the inorganic layers 321 and 323, in addition to preventing moisture permeation. Further, since the organic layer 322 is planarizing, an uppermost surface of the thin film encapsulation layer 320 can be planarized by the organic layer 322.

According to an embodiment, the fingerprint sensing unit 10 is disposed on the display unit 20 that includes the base substrate 210, the driving circuit portion 230, the pixel defining layer 290, the OLED 310, and the thin film encapsulation layer 320. An adhesive member is further disposed between the fingerprint sensing unit 10 and the display unit 20.

The fingerprint sensing unit 10 according to an embodiment of the present disclosure has an opening 155 in the first, second, and third insulating layers IL1, IL2, and IL3. The opening 155 of the fingerprint sensing unit 10 overlaps the pixel opening 295 of the display unit 20. In addition, the sensing electrode SE disposed in the opening 155 corresponds to the OLED 310. That is, one sensing electrode SE overlaps one first electrode 311. However, embodiments are not limited thereto, and one sensing electrode SE may correspond to a plurality of OLEDs 310.

According to an embodiment, since the fingerprint sensing unit 10 has the opening 155 in the first, second, and third insulating layers IL1, IL2, and IL3 between the substrate 110 and the sensing electrode SE, external light reflection can be reduced, and display quality can be improved.

As set forth hereinabove, according to one or more embodiments, a fingerprint sensing unit and a display device that includes a fingerprint sensing unit has an opening in an insulating layer between a substrate and a sensing electrode, which can reduce reflection of external light in the fingerprint sensing unit and improve display quality of the display device.

While embodiments of the present disclosure have been illustrated and described with reference to exemplary embodiments thereof, it will be apparent to those of ordinary skill in the art that various changes in form and detail may be formed thereto without departing from the spirit and scope of exemplary embodiments of the present disclosure.

What is claimed is:

1. A fingerprint sensing unit, comprising:
   a substrate;
   a buffer layer disposed on the substrate;
   a thin film transistor disposed on the buffer layer;
   an insulating layer disposed on the buffer layer and that has an opening that exposes at least a portion of the buffer layer; and
   a sensing electrode disposed on the portion of the buffer layer that is exposed by the opening, wherein the sensing electrode is connected to the thin film transistor.

2. The fingerprint sensing unit of claim 1, wherein the sensing electrode directly contacts the buffer layer.

3. The fingerprint sensing unit of claim 1, wherein only the buffer layer is disposed between at least a part of the sensing electrode and the substrate.

4. The fingerprint sensing unit of claim 1, wherein an area of the opening ranges from about 50% to about 80% of a planar area of the substrate.

5. The fingerprint sensing unit of claim 1, wherein an area of the insulating layer ranges from about 20% to about 50% of a planar area of the substrate.

6. The fingerprint sensing unit of claim 1, wherein an edge of the opening forms a closed loop on a plane, and the closed loop has one of a circular, polygonal or irregular shape.

7. The fingerprint sensing unit of claim 1, wherein the buffer layer comprises one of silicon nitride (SiN$_x$), silicon oxide (SiO$_2$), or silicon oxynitride (SiO$_x$N$_y$).

8. The fingerprint sensing unit of claim 1, wherein the insulating layer comprises a first insulating layer, a second insulating layer, and a third insulating layer.

9. The fingerprint sensing unit of claim 8, wherein the thin film transistor comprises:
   an active layer disposed between the buffer layer and the first insulating layer;
   a gate electrode disposed between the first insulating layer and the second insulating layer; and
   a source electrode and a drain electrode disposed between the second insulating layer and the third insulating layer.

10. A fingerprint sensing unit, comprising:
    a substrate;
    a thin film transistor disposed on the substrate;
    a first insulating layer disposed on the substrate;
    a second insulating layer disposed on the first insulating layer and that has an opening that exposes at least a portion of the first insulating layer; and
    a sensing electrode disposed on the portion of the first insulating layer that is exposed by the opening, wherein the sensing electrode is connected to the thin film transistor.

11. The fingerprint sensing unit of claim 10, wherein the sensing electrode directly contacts the first insulating layer.

12. The fingerprint sensing unit of claim 10, wherein only the first insulating layer is disposed between at least a part of the sensing electrode and the substrate.

13. The fingerprint sensing unit of claim 10, wherein an area of the opening ranges from about 50% to about 80% of a planar area of the substrate.

14. The fingerprint sensing unit of claim 10, wherein the first insulating layer comprises one of silicon nitride (SiN$_x$), silicon oxide (SiO$_2$), or silicon oxynitride (SiO$_x$N$_y$).

15. The fingerprint sensing unit of claim 10, further comprising a third insulating layer disposed on the second insulating layer,
    wherein the second and third insulating layers have the opening that exposes at least a portion of the first insulating layer.

16. A display device, comprising:
    a display unit; and
    a fingerprint sensing unit disposed on the display unit,
    wherein the display unit comprises:
       a base substrate; and
       an organic light emitting element disposed on the base substrate, and
    the fingerprint sensing unit comprises:
       a buffer layer disposed on the display unit;
       a thin film transistor disposed on the buffer layer;
       an insulating layer disposed on the buffer layer and that has an opening that exposes at least a portion of the buffer layer; and
       a sensing electrode disposed on the portion of the buffer layer that is exposed by the opening, wherein the sensing electrode is connected to the thin film transistor.

17. The display device of claim 16, wherein the organic light emitting element comprises:
    a first electrode;
    an organic light emitting layer disposed on the first electrode; and
    a second electrode disposed on the organic light emitting layer.

18. The display device of claim 17, wherein the sensing electrode overlaps the first electrode, and
the sensing electrode directly contacts the buffer layer.

19. The display device of claim 17, further comprising a pixel defining layer disposed on the base substrate and that has a pixel opening that exposes at least a part of the first electrode.

20. The display device of claim 19, wherein the opening overlaps the pixel opening.

* * * * *